(12) United States Patent
Lin et al.

(10) Patent No.: US 10,431,676 B2
(45) Date of Patent: Oct. 1, 2019

(54) SEMICONDUCTOR DEVICE AND METHOD FOR FORMING THE SAME

(71) Applicant: Vanguard International Semiconductor Corporation, Hsinchu (TW)

(72) Inventors: Hsin-Chih Lin, Hsinchu (TW); Yu-Chieh Chou, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 76 days.

(21) Appl. No.: 15/857,347

(22) Filed: Dec. 28, 2017

(65) Prior Publication Data

US 2019/0207020 A1   Jul. 4, 2019

(51) Int. Cl.
| | |
|---|---|
| *H01L 29/20* | (2006.01) |
| *H01L 29/778* | (2006.01) |
| *H01L 29/78* | (2006.01) |
| *H01L 29/205* | (2006.01) |
| *H01L 21/02* | (2006.01) |
| *H01L 29/66* | (2006.01) |
| H01L 21/308 | (2006.01) |
| H01L 21/306 | (2006.01) |

(52) U.S. Cl.
CPC ...... *H01L 29/7787* (2013.01); *H01L 21/0254* (2013.01); *H01L 29/2003* (2013.01); *H01L 29/205* (2013.01); *H01L 29/66462* (2013.01); *H01L 29/66795* (2013.01); *H01L 29/7851* (2013.01); *H01L 21/02271* (2013.01); *H01L 21/3081* (2013.01); *H01L 21/3086* (2013.01); *H01L 21/30621* (2013.01)

(58) Field of Classification Search
CPC ................ H01L 29/7787; H01L 29/2003; H01L 29/205
See application file for complete search history.

(56) References Cited

U.S. PATENT DOCUMENTS

2015/0340237 A1   11/2015   Rezanezhad Gatabi
2017/0117400 A1*  4/2017   Xiao ............... H01L 21/823418

FOREIGN PATENT DOCUMENTS

TW     201637210 A    10/2016
TW     201715616 A    5/2017

OTHER PUBLICATIONS

Taiwanese Office Action and Search Report, dated Sep. 21, 2018, for Taiwanese Application No. 106138596.

* cited by examiner

*Primary Examiner* — Douglas M Menz
(74) *Attorney, Agent, or Firm* — Birch, Stewart, Kolasch & Birch, LLP

(57) ABSTRACT

A semiconductor device is provided. The semiconductor device includes a substrate and a first III-V group compound semiconductor layer disposed on the substrate. The first III-V group compound semiconductor layer includes a fin structure having a top surface, a first sidewall, and a second sidewall opposite to the first sidewall. The semiconductor device also includes a second III-V group compound semiconductor layer disposed on the first III-V group compound semiconductor layer. The first III-V group compound semiconductor layer and the second III-V group compound semiconductor layer are made of different materials. The semiconductor device also includes a gate electrode disposed on the second III-V group compound semiconductor layer.

20 Claims, 8 Drawing Sheets

SEMICONDUCTOR DEVICE AND METHOD FOR FORMING THE SAME

BACKGROUND

Embodiments of the present disclosure relate to a semiconductor device, and in particular they relate to a high electron mobility transistor (HEMT) or a high hole mobility transistor (HHMT).

Semiconductor devices are used in a variety of electronic applications, such as high-power devices, personal computers, cell phones, digital cameras, and other electronic devices. These semiconductor devices are typically fabricated by depositing an insulating layer or dielectric layer, a conductive layer material, and a semiconductor layer material on the semiconductor substrate, followed by patterning the various material layers by using a photolithography process. Therefore, the circuit devices and components are formed on the semiconductor substrate.

Among these devices, high electron mobility transistors or high hole mobility transistors have been widely used in the field of high-power applications since they have advantages such as high output power and high breakdown voltage.

However, existing high electron mobility transistors or high hole mobility transistors are not satisfactory in every respect.

SUMMARY

Some embodiments of the present disclosure relate to a semiconductor device. The semiconductor device includes a substrate with a first III-V group compound semiconductor layer disposed on the substrate. The first III-V group compound semiconductor layer comprises a fin structure comprising a top surface, a first sidewall, and a second sidewall opposite to the first sidewall. The semiconductor device also includes a second III-V group compound semiconductor layer disposed on the first III-V group compound semiconductor layer. The first III-V group compound semiconductor layer and the second III-V group compound semiconductor layer are made of different materials, and the second III-V group compound semiconductor layer covers the top surface, the first sidewall, and the second sidewall of the fin structure to form a heterojunction along the top surface, the first sidewall, and the second sidewall of the fin structure. The semiconductor device also includes a gate electrode disposed on the second III-V group compound semiconductor layer.

Some embodiments of the present disclosure relate to a method of forming a semiconductor device. The method includes providing a substrate, forming a first III-V group compound semiconductor layer on the substrate. The first III-V group compound semiconductor layer comprises a fin structure comprising a top surface, a first sidewall, and a second sidewall opposite to the first sidewall. The method also includes forming a second III-V group compound semiconductor layer on the first III-V group compound semiconductor layer. The first III-V group compound semiconductor layer and the second III-V group compound semiconductor layer are made of different materials, and the second III-V group compound semiconductor layer covers the top surface, the first sidewall, and the second sidewall of the fin structure to form a heterojunction along the top surface, the first sidewall, and the second sidewall of the fin structure. The method also includes forming a gate electrode on the second III-V group compound semiconductor layer.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
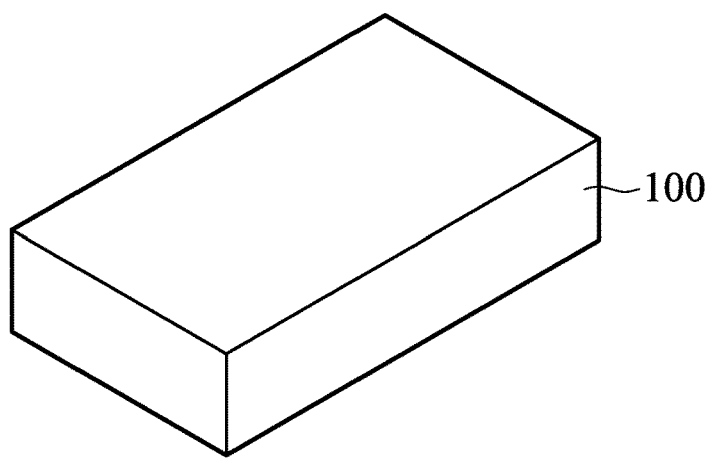
FIGS. 1, 2, 3, 4A, and 5A are a series of partial perspective views illustrating a method of forming a high electron mobility transistor 10 of the first embodiment of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

It should be understood that additional steps can be implemented before, during, or after the illustrated methods, and some steps might be replaced or omitted in other embodiments of the illustrated methods.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The high electron mobility transistor and the high hole mobility transistor of the embodiments of the present disclosure include a III-V group compound semiconductor layer having a fin structure. The fin structure may increase the area of the two-dimensional electron gas (2DEG) or the two-dimensional hole gas (2DHG), and thus the device performance may be improved.

The First Embodiment: High Electron Mobility Transistor

FIG. 1 illustrates a partial perspective view of an initial step of a method for forming a high electron mobility transistor of the present embodiment. First, as shown in FIG. 1, a substrate 100 is provided. In this embodiment, the substrate 100 is a sapphire substrate, but the present disclosure is not limited thereto. For example, the substrate 100 may include elementary semiconductor such as silicon (Si) or germanium (Ge). In some embodiments, the substrate 100 may include compound semiconductor such as silicon carbide (SiC), gallium arsenic (GaAs), indium arsenide (InAs), or indium phosphide (InP). In some embodiments, the substrate 100 may include alloy semiconductor such as silicon germanium (SiGe), silicon germanium carbide (SiGeC), gallium arsenic phosphide (GaAsP), or gallium indium phosphide (GaInP). In some embodiments, the substrate 100 may be a single crystal substrate, a multi-layer substrate, a gradient substrate, other applicable substrates, or a combination thereof. In some embodiments, the substrate may include a semiconductor-on-insulator (SOI) substrate (e.g., a silicon-on-insulator substrate or a germanium-on-insulator substrate), and the semiconductor-on-insulator (SOI) substrate may include a bottom substrate, a buried oxide (BOX) layer disposed on the bottom substrate, and a semiconductor layer disposed on the buried oxide layer.

In some embodiments, the substrate 100 may include a buffer layer (not shown in the figure) to avoid or reduce the defects resulting from the lattice mismatch between the substrate 100 and the overlying layers. For example, the buffer layer may include AlN, AlGaN, other applicable materials, or a combination thereof.

Figure 2:
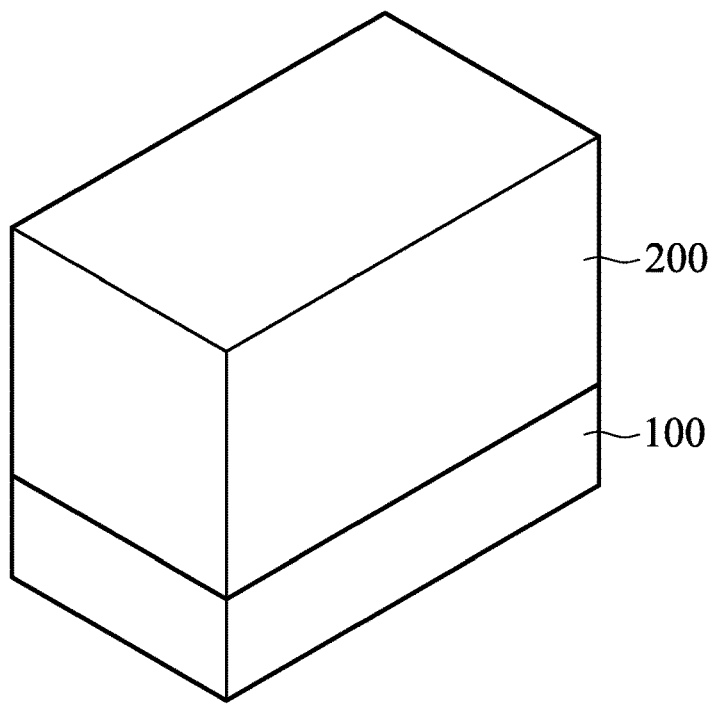

Then, as shown in FIG. 2, a first III-V group compound semiconductor layer 200 is formed on the substrate 100. In some embodiments, the first III-V group compound semiconductor layer 200 may include an undoped III-V group compound semiconductor material. For example, in this embodiment, the first III-V group compound semiconductor layer 200 is made of undoped GaN, but the present disclosure is not limited thereto. In some other embodiments, the first III-V group compound semiconductor layer 200 may include AlGaN, AlN, GaAs, GaInP, AlGaAs, InP, InAlAs, InGaAs, other applicable III-V group compound materials, or a combination thereof. In some embodiments, the first III-V group compound semiconductor layer 200 may be formed on the substrate 100 using a molecular-beam epitaxy method (MBE), a metalorganic chemical vapor deposition method (MOCVD), a hydride vapor phase epitaxy method (HVPE), other applicable methods, or a combination thereof.

Figure 3:
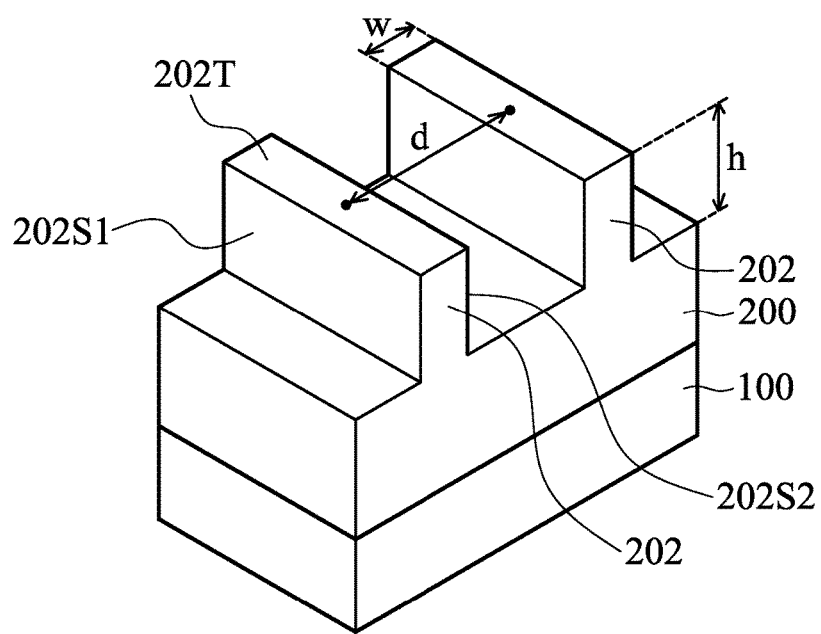

Then, as shown in FIG. 3, the first III-V group compound semiconductor layer 200 is patterned to form one or more fin structures 202. For example, a hard mask layer (not shown in the figure) including a material, such as silicon nitride or silicon oxide, may be formed on the first III-V group compound semiconductor layer 200 using a low-pressure chemical vapor deposition (LPCVD) process, a plasma-enhanced chemical vapor deposition (PECVD) process, another applicable process, or a combination thereof, and then a patterned photoresist may be formed on the hard mask layer using a photolithography process (e.g., photoresist coating, soft baking, exposure, post-exposure baking, and developing), and then an etching process (e.g., a wet etching process or a dry etching process) may be performed to pattern the hard mask layer using the patterned photoresist as an etch mask. Then, an etching process (e.g., a wet etching process or a dry etching process) using the patterned hard mask layer as an etch mask may be performed to etch the first III-V group compound semiconductor layer 200 to form one or more fin structures 202. For example, the dry etching process may include a plasma etching process, or a reactive ion etching process.

It should be understood that the present embodiment uses two fin structures 202 as an example for the interest of clarity, but the present disclosure is not limited thereto. One skilled in the art can form other numbers of fin structures 202 depending on their design needs.

In some embodiments, an isolation structure (not shown in the figure) may be formed on the substrate 100. For example, a dielectric material may be formed on the first III-V group compound semiconductor layer 200 and the fin structures 202 using a chemical vapor deposition process (e.g., a sub-atmospheric chemical vapor deposition process (SACVD), or a high-density plasma chemical vapor deposition process (HDPCVD)), and then a process, such as an etch-back process, may be performed to remove the excess portion of the dielectric material, while the remaining portion of the dielectric material forms the isolation structure between the fin structures 202. In some embodiments, a top surface of the isolation structure is below a top surface 202T of the fin structure 202. For example, the isolation structure may include silicon oxide, silicon nitride, silicon carbonitride, silicon carbon oxynitride, other applicable materials, or a combination thereof.

Still referring to FIG. 3, each of the fin structures 202 may have a top surface 202T, a first sidewall 202S1, and a second sidewall 202S2 opposite to the first sidewall 202S1. In some embodiments, a second III-V group compound semiconductor layer formed in a subsequent process (e.g., the second III-V group compound semiconductor layer 402 illustrated in FIG. 4A) may cover the top surface 202T, the first sidewall 202S1, and the second sidewall 202S2 of the fin structure 202. Therefore, the area of the two-dimensional electron gas may be increased, and thus the performance of the high electron mobility transistor may be improved. The details are discussed below.

As shown in FIG. 3, each of the fin structures 202 has a height h and a width w. In some embodiments where the ratio of the width w to the height h (i.e., w/h) is less than 0.2, the two-dimensional electron gas may not be formed on the first sidewall 202S1 and the second sidewall 202S2. In other embodiments where the ratio of the width w to the height h (i.e., w/h) is greater than 10, the two-dimensional electron gas may not be formed on the top surface 202T. Therefore, in this embodiment, the ratio of the width w to the height h (i.e., w/h) is in a range between 0.2 and 10, so as to avoid the above disadvantages resulting from the ratio of the width w to the height h being too large or too small. For example, the height h may be in a range between 0.1 and 2 µm, and the width w may be in a range between 0.1 and 2 µm.

In some embodiments, a distance (or pitch) d of two adjacent fin structures 202 in a direction perpendicular to the sidewalls of the fin structures may be in a range between 0.04 and 10 µm.

Figure 4A:
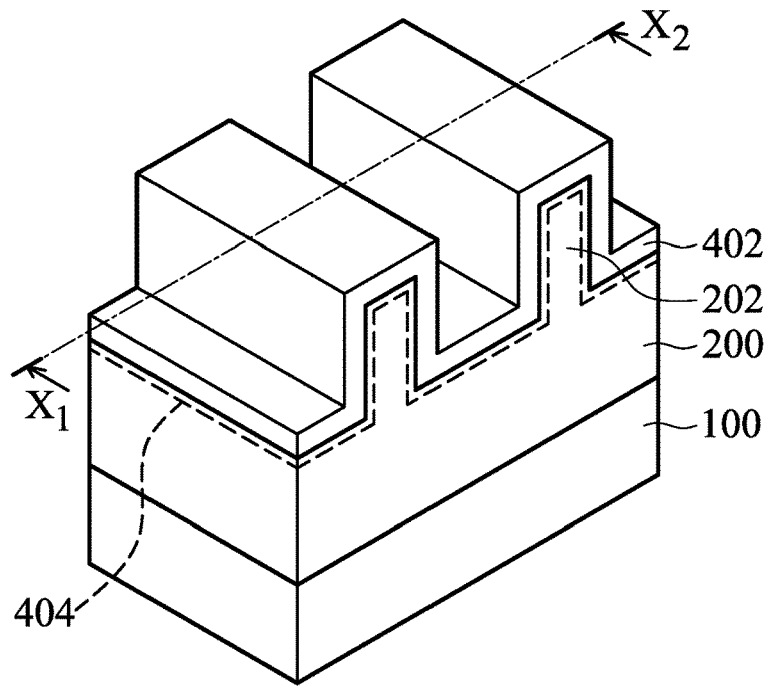
Figure 4B:
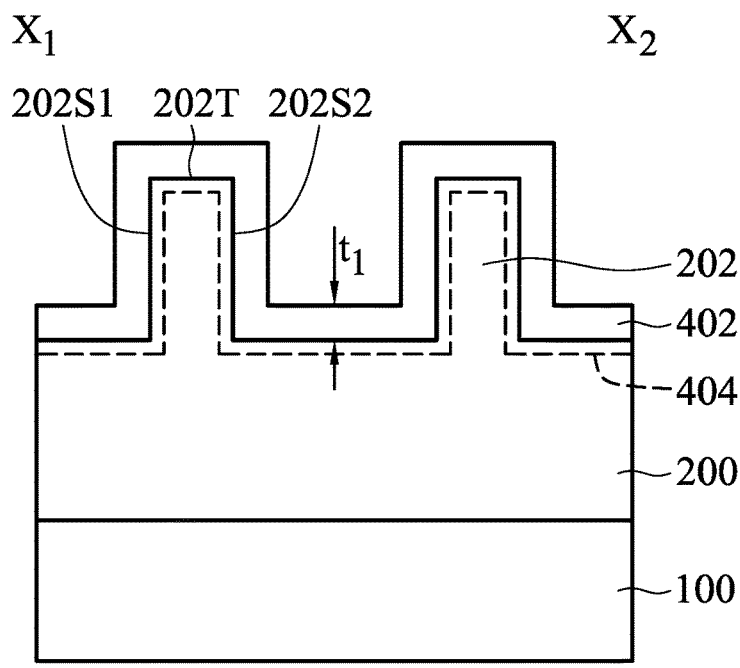
FIG. 4B illustrates a process cross-sectional view of the high electron mobility transistor 10 of the first embodiment of the present disclosure along the cut line $X_1$-$X_2$ of FIG. 4A.

Then, as shown in FIGS. 4A and 4B, a second III-V group compound semiconductor layer 402 is formed on the first III-V group compound semiconductor layer 200. FIG. 4B is a cross-sectional view along the cut line $X_1$-$X_2$ of FIG. 4A, and the cut line $X_1$-$X_2$ is substantially perpendicular to the sidewalls of the fin structures 202.

In some embodiments, the second III-V group compound semiconductor layer 402 and the first III-V group compound semiconductor layer 200 include different materials from each other to form a heterojunction, and thus a two-dimensional electron gas 404 which can serve as the carriers of the high electron mobility transistor may be formed in the first III-V group compound semiconductor layer 200. In some embodiments, the second III-V group compound semiconductor layer 402 may include an undoped III-V group compound semiconductor material. For example, in this embodiment, the second III-V group compound semiconductor layer 402 is made of undoped AlGaN, thus forming a heterojunction with the first III-V group compound semiconductor layer 200 which is made of undoped GaN. However, the present disclosure is not limited thereto. In some other embodiments, the second III-V group compound semiconductor layer 402 may also include GaN, AlN, GaAs, GaInP, AlGaAs, InP, InAlAs, InGaAs, other applicable III-V group compound materials, or a combination thereof. For example, the second III-V group compound semiconductor layer 402 may be formed on the first III-V group compound semiconductor layer 200 using a molecular-beam epitaxy method (MBE), a metalorganic chemical vapor deposition method (MOCVD), a hydride vapor phase epitaxy method (HVPE), other applicable methods, or a combination thereof.

As shown in FIG. 4B, the second III-V group compound semiconductor layer 402 simultaneously covers the top surface 202T, the first sidewall 202S1, and the second sidewall 202S2 of the fin structure 202 of the first III-V group compound semiconductor layer 200. In other words, compared to conventional planar devices, the second III-V group compound semiconductor layer 402 and the first III-V group compound semiconductor layer 200 of the high electron mobility transistor of the embodiment of the present disclosure have a greater contact area, so that the area of the two-dimensional electron gas may be increased. Therefore, the high electron mobility transistor of the embodiment of the present disclosure may have a larger current flow during operation, thus improving the device performance. For example, in some embodiments of the present disclosure, the current flow of the high electron mobility transistor during operation may be twice to five times the current flow of the conventional planar device.

In some embodiments, as shown in FIGS. 4A and 4B, the second III-V group compound semiconductor layer 402 is conformally formed on the fin structures 202 of the first III-V group compound semiconductor layer 200. In other words, in these embodiments, the space (or gap) between the fin structures 202 (e.g., between adjacent fin structures 202) is not fully filled by the second III-V group compound semiconductor layer 402. Therefore, a gate electrode (e.g., the gate electrode 504 illustrated in FIG. 5A) formed in a subsequent process may extend into the space (or gap) between the fin structures 202, and thus the contact area of the gate electrode and the second III-V group compound semiconductor layer 402 may be increased, such that the gate electrode may control the current flow more effectively during the operation.

In some embodiments, as shown in FIG. 4B, a thickness $t_1$ of the second III-V group compound semiconductor layer 402 may be in a range between 0.005 to 0.1 µm.

Figure 5A:
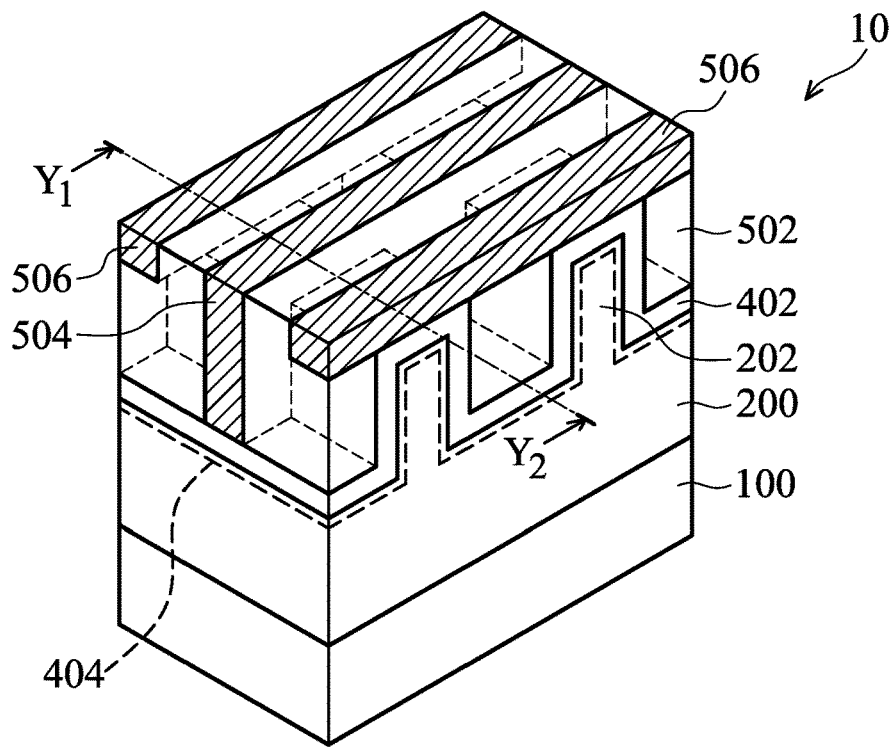

Then, as shown in FIG. 5A, an insulating layer 502 is formed on the second III-V group compound semiconductor layer 402. The insulating layer 502 may protect the underlying layers and provide physical isolation and structural support. For example, the insulating layer 502 may include $SiO_2$, $SiN_3$, $SiON$, $Al_2O_3$, AlN, polyimide (PI), benzocyclobutene (BCB), polybenzoxazole (PBO), other applicable insulating materials, or a combination thereof. In some embodiments, the insulating layer 502 may be formed using a chemical vapor deposition process (e.g., metalorganic chemical vapor deposition process), a spin-on coating process, other applicable processes, or a combination thereof. In some embodiments, the insulating layer 502 may be planarized to have a planar top surface through a chemical mechanical polishing (CMP) process.

Then, as shown in FIG. 5A, the high electron mobility transistor 10 of the present embodiment is formed by forming a gate electrode 504 on the second III-V group compound semiconductor layer 402, and forming source/drain electrodes 506 at opposite sides of the gate electrode 504. In some embodiments, as shown in FIG. 5A, the gate electrode 504 not only covers the second III-V group compound semiconductor layer 402 on the top surface 202T of the fin structure 202, but also covers the second III-V group compound semiconductor layer 402 on the first sidewall 202S1 and second sidewall 202S2 of the fin structure 202. In other words, in these embodiments, the gate electrode 504 and the second III-V group compound semiconductor layer 402 have a larger contact area, so that the gate electrode 504 can more effectively control the current flow during the device operation.

For example, the gate electrode 504 may include metals, metal silicides, poly-silicon, other applicable conductive materials, or a combination thereof. For example, the source/drain electrodes 506 may include Ti, Al, Au, Pd, other applicable metals, alloys thereof, or a combination thereof. In some embodiments, a photolithography process and an etching process may be performed to form a trench corresponding to the gate electrode 504 and trenches corresponding to the source/drain electrodes 506 in the insulating layer 502, and then a chemical vapor deposition process, a physical vapor deposition process (e.g., evaporation or sputtering), an electroplating process, an atomic layer deposition process (ALD), other applicable processes, or a combination thereof may be performed to fill these trenches with conductive materials, whereby the gate electrode 504 and the source/drain electrodes 506 are formed.

Figure 5B:
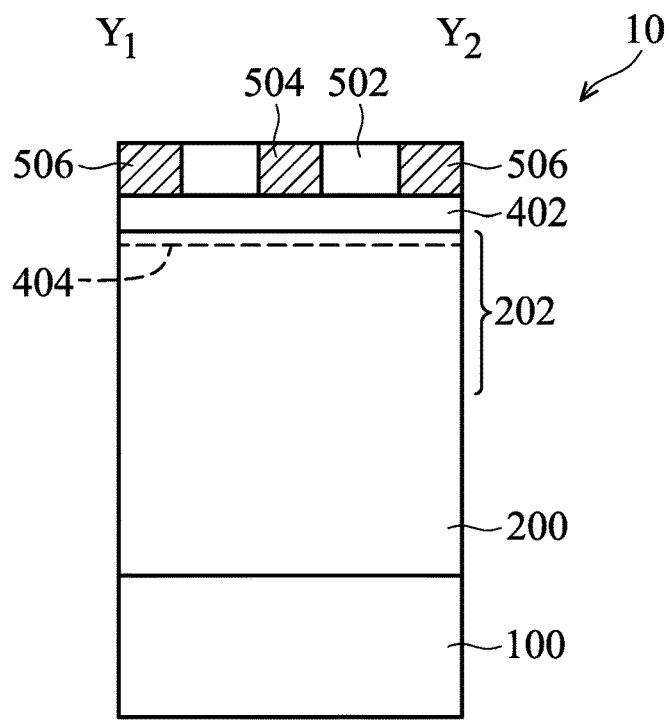
FIG. 5B illustrates a partial cross-sectional view of the high electron mobility transistor 10 of the first embodiment of the present disclosure along the cut line $Y_1$-$Y_2$ of FIG. 5A.

Referring to FIG. 5B, it illustrates a partial cross-sectional view of the high electron mobility transistor 10 of the preset embodiment along the cut line $Y_1$-$Y_2$ of FIG. 5A. In more detail, the cut line $Y_1$-$Y_2$ is perpendicular to the cut line $X_1$-$X_2$ discussed above. As shown in FIG. 5B, the high electron mobility transistor 10 is a depletion mode (i.e., normally-on) semiconductor device, the fin structure 202 under the gate electrode 504 can serve as a channel, and the fin structure 202 at opposite sides of the gate electrode 504 can serve as a source/drain region.

In summary, the high electron mobility transistor of the preset embodiment includes III-V group compound semiconductor layer having one or more fin structures. The fin structure can increase the contact area of the heterojunction. Therefore, the area of the two-dimensional electron gas can be increased, and thus the device performance can be improved.

Figure 5C:
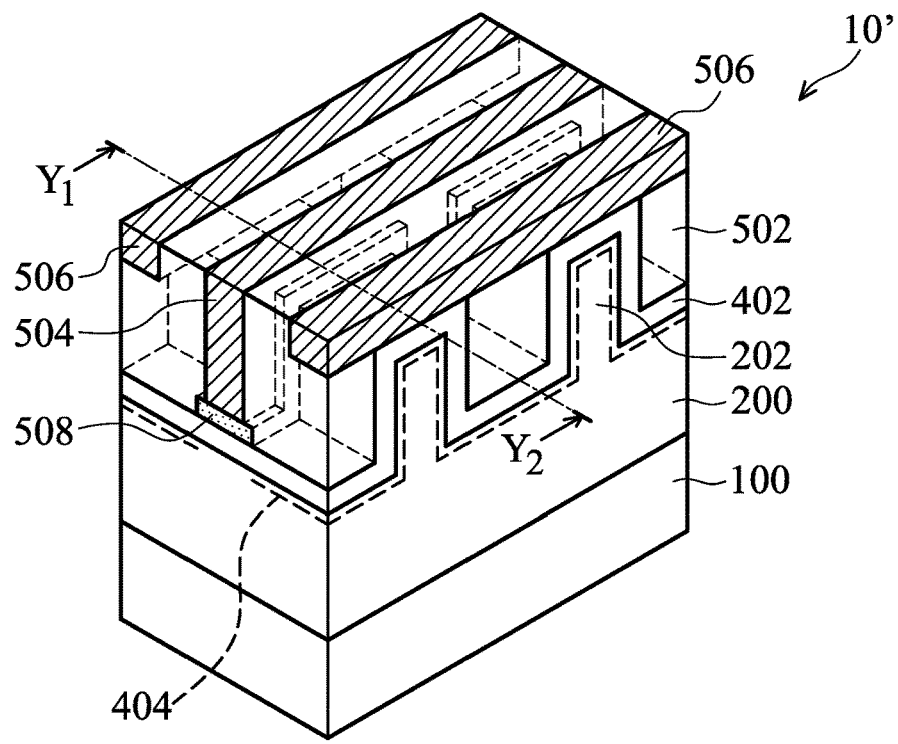
FIG. 5C illustrates a partial perspective view of a high electron mobility transistor 10' according to some embodiments of the present disclosure.
Figure 5D:
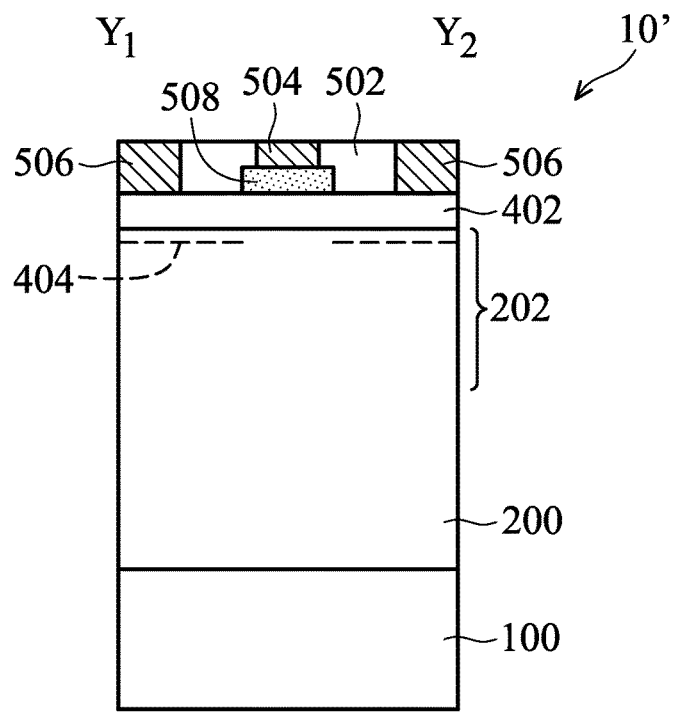
FIG. 5D illustrates a partial cross-sectional view of the high electron mobility transistor 10' of some embodiments of the present disclosure along the cut line $Y_1$-$Y_2$ of FIG. 5C.

Some variations of the present embodiment will be provided below. In some embodiments, as shown in FIGS. 5C and 5D, the high electron mobility transistor 10' further includes a first doped III-V group compound semiconductor layer 508 disposed between the gate electrode 504 and the second III-V group compound semiconductor layer 402. Therefore, the high electron mobility transistor 10' is an enhanced mode (i.e., normally-off) semiconductor device.

In some embodiments, the first doped III-V group compound semiconductor layer 508 includes a p-type III-V group compound semiconductor material, and it may include Mg, other applicable dopants, or a combination thereof. For example, in the present embodiment, the first doped III-V group compound semiconductor layer 508 is made of p-type GaN. However, the present disclosure is not limited thereto. In some other embodiments, the first doped III-V group compound semiconductor layer 508 may also include p-type AlGaN, p-type AlN, p-type GaAs, p-type GaInP, p-type AlGaAs, p-type InP, p-type InAlAs, p-type InGaAs, other applicable III-V group compound semiconductor materials doped with p-type dopants, or a combination thereof.

For example, the dopant concentration in the first doped III-V group compound semiconductor layer 508 may be in a range between $1\times10^{15}$ cm$^{-3}$ and $1\times10^{20}$ cm$^{-3}$.

In some embodiments, before forming the insulating layer 502, a molecular-beam epitaxy method (MBE), a metalorganic chemical vapor deposition method (MOCVD), a hydride vapor phase epitaxy method (HVPE), other applicable methods, or a combination thereof may be used to form an undoped III-V group compound semiconductor blanket layer on the second III-V group compound semiconductor layer 402, and a process such as ion implantation process may be used to dope the dopants into the undoped III-V group compound semiconductor blanket layer to form a doped III-V group compound semiconductor blanket layer. Then, the doped III-V group compound semiconductor blanket layer may be patterned to form the first doped III-V group compound semiconductor layer 508. For example, the patterning process may include a photolithography process, an etching process, other applicable processes, or a combination thereof. In some embodiments, an in-situ doping process may be used to form the first doped III-V group compound semiconductor layer 508.

Since the enhanced mode high electron mobility transistor 10' also includes a III-V group compound semiconductor layer having one or more fin structures, it also has a larger area of the two-dimensional electron gas. Therefore, the device performance may be improved.

The Second Embodiment: High Hole Mobility Transistor

Figure 6A:
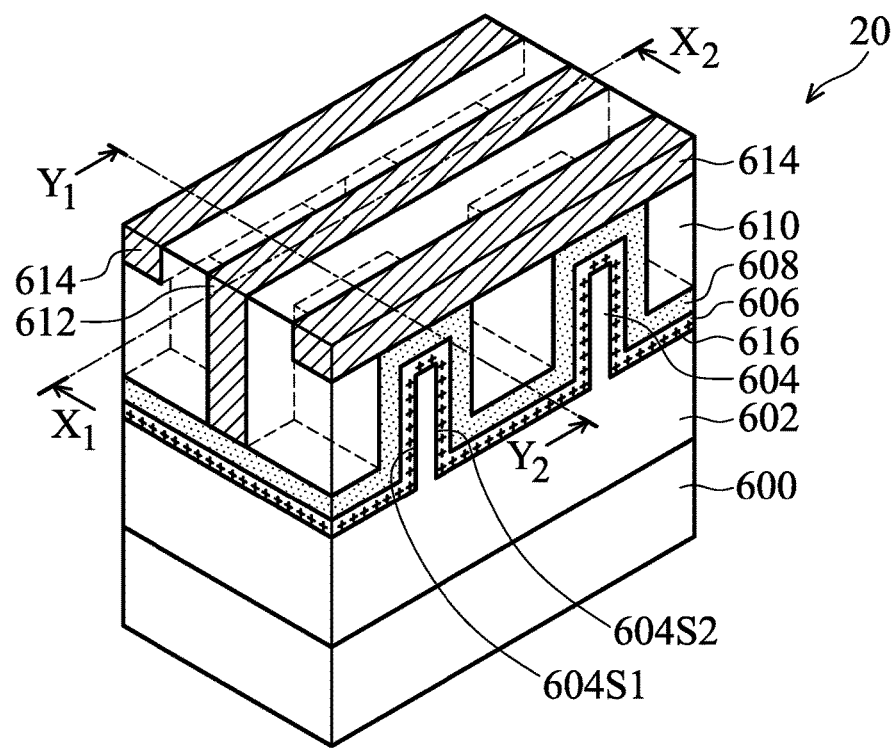
FIG. 6A illustrates a partial perspective view of a high hole mobility transistor 20 according to the second embodiment of the present disclosure.
Figure 6B:
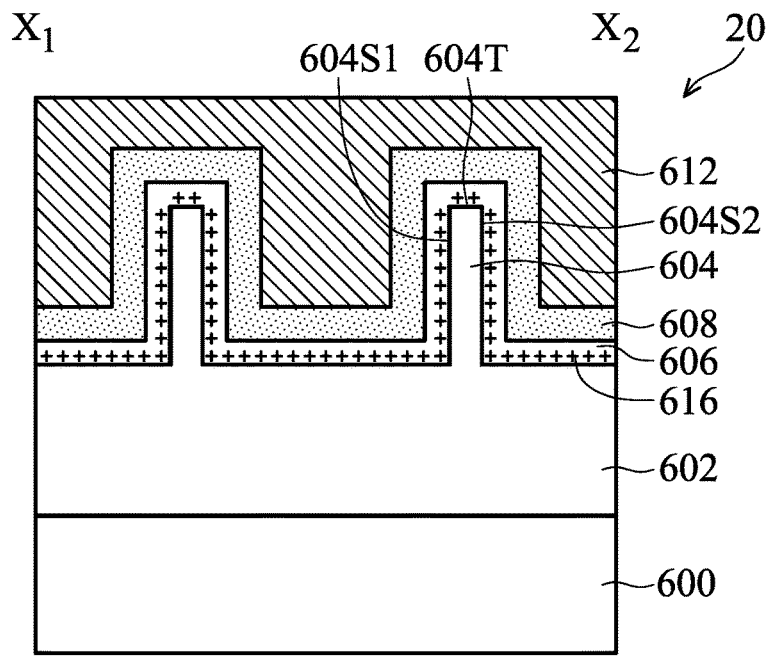
FIG. 6B illustrates a partial cross-sectional view of the high hole mobility transistor 20 of the second embodiment of the present disclosure along the cut line $X_1$-$X_2$ of FIG. 6A.
Figure 6C:
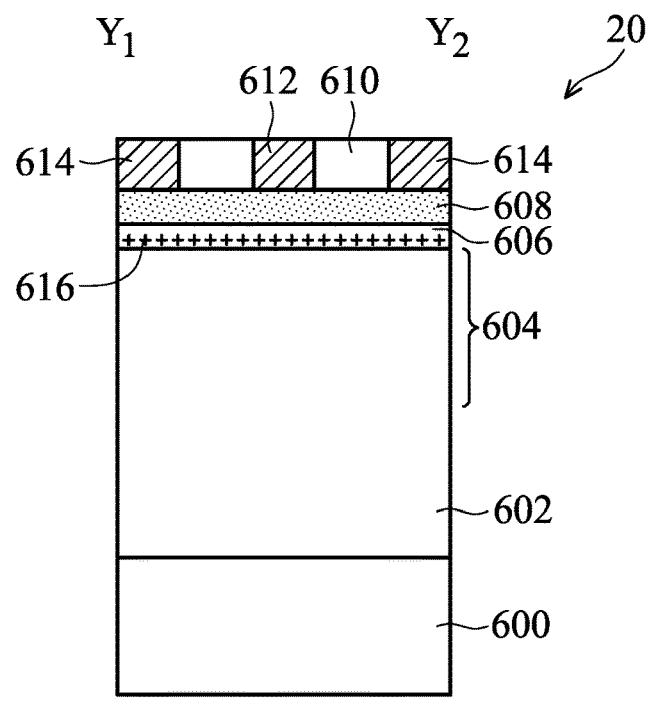
FIG. 6C illustrates a partial cross-sectional view of the high hole mobility transistor 20 of the second embodiment of the present disclosure along the cut line $Y_1$-$Y_2$ of FIG. 6A.

FIGS. 6A, 6B, and 6C illustrate the partial perspective view and cross-sectional views of the depletion mode high hole mobility transistor 20 of the second embodiment. FIG. 6B is a partial cross-sectional view of the depletion mode high hole mobility transistor 20 along the cut line $X_1$-$X_2$ of FIG. 6A, and FIG. 6C is a partial cross-sectional view of the depletion mode high hole mobility transistor 20 along the cut line $Y_1$-$Y_2$ of FIG. 6A.

As shown in FIGS. 6A, 6B, and 6C, the depletion mode high hole mobility transistor 20 may include a substrate 600, a first III-V group compound semiconductor layer 602 disposed on the substrate 600, a second III-V group compound semiconductor layer 606 disposed on the first III-V group compound semiconductor layer 602, a first doped III-V group compound semiconductor layer 608 disposed on the second III-V group compound semiconductor layer 606, an insulating layer 610 disposed on the first doped III-V group compound semiconductor layer 608, a gate electrode 612, and source/drain electrodes 614 disposed at opposite sides of the gate electrode 612.

For example, the substrate 610 may be the same as, or similar to, the substrate 100 of the above embodiments. For example, the insulating layer 610 may be the same as, or similar to, the insulating layer 502 of the above embodiments, and may be formed using the same or similar processes for forming the insulating layer 502. For example, the gate electrode 612 and the source/drain electrodes 614 may be the same as, or similar to, the gate electrode 504 and the source/drain electrodes 506 of the above embodiments, and may be formed using the same or similar processes for forming the gate electrode 504 and the source/drain electrodes 506.

In some embodiments, the second III-V group compound semiconductor layer 606 and the first III-V group compound semiconductor layer 602 include different materials from each other to form a heterojunction, and the first doped III-V group compound semiconductor layer 608 is disposed on the second III-V group compound semiconductor layer 606, such that a two-dimensional hole gas 616 (as illustrated in FIGS. 6A, 6B, and 6C) is formed. The two-dimensional hole gas 616 can serve as the carriers of the high hole mobility transistor 20.

As shown in FIGS. 6A, 6B, and 6C, the first III-V group compound semiconductor layer 602 of the depletion mode high hole mobility transistor 20 also includes the fin structure 604, and the second III-V group compound semiconductor layer 606 and the first doped III-V group compound semiconductor layer 608 cover the top surface 604T, opposite sidewalls 604S1 and 604S2 of the fin structures 604. Therefore, the area of the two-dimensional hole gas 616 can be increased, and thus the performance of the depletion mode high hole mobility transistor 20 can be improved.

In some embodiments, first III-V group compound semiconductor layer 602 and the second III-V group compound semiconductor layer 606 may respectively include the undoped III-V group compound semiconductor materials of the above embodiments (e.g., GaN, AlGaN, AlN, GaAs, GaInP, AlGaAs, InP, InAlAs, InGaAs, other applicable III-V group compound materials, or a combination thereof), and the first doped III-V group compound semiconductor layer 608 may include the p-type III-V group compound semiconductor materials of the above embodiments (e.g., p-type GaN, p-type AlGaN, p-type AlN, p-type GaAs, p-type GaInP, p-type AlGaAs, p-type InP, p-type InAlAs, p-type InGaAs, other applicable doped III-V group compound materials, or a combination thereof). For example, in this embodiment, the first III-V group compound semiconductor layer 602 includes undoped AlGaN, the second III-V group compound semiconductor layer 606 includes undoped GaN, and the first doped III-V group compound semiconductor layer 608 includes p-type GaN.

In some embodiments, the dopant concentration in the first doped III-V group compound semiconductor layer 608 may be in a range between $1 \times 10^{13}$ cm$^{-3}$ and $1 \times 10^{22}$ cm$^{-3}$.

In some embodiments, the above III-V group compound semiconductor layers may be formed using a molecular-beam epitaxy method (MBE), a metalorganic chemical vapor deposition method (MOCVD), a hydride vapor phase epitaxy method (HVPE), other applicable methods, or a combination thereof. For example, the first doped III-V group compound semiconductor layer 608 may be in-situ doped or be doped by an ion implantation process.

In some embodiments, as shown in FIGS. 6A, and 6B, the second III-V group compound semiconductor layer 606 is conformally formed on the fin structures 604 of the first III-V group compound semiconductor layer 602, and the first doped III-V group compound semiconductor layer 608 is also conformally formed on the second III-V group compound semiconductor layer 606. In other words, in these embodiments, the space (or gap) between the fin structures 604 is not fully filled by the second III-V group compound semiconductor layer 606 and the first doped III-V group compound semiconductor layer 608. Therefore, the gate electrode 612 may extend into the space (or gap) between the fin structures 604, and thus the contact area of the gate electrode 612 and the first doped III-V group compound semiconductor layer 608 may be increased. Therefore, the gate electrode 612 may control the current flow more effectively during the operation.

In summary, the high hole mobility transistor of the preset embodiment includes III-V group compound semiconductor layer having one or more fin structures. The fin structure can increase the contact area of the heterojunction. Therefore, the area of the two-dimensional hole gas can be increased, and thus the device performance can be improved.

Figure 6D:
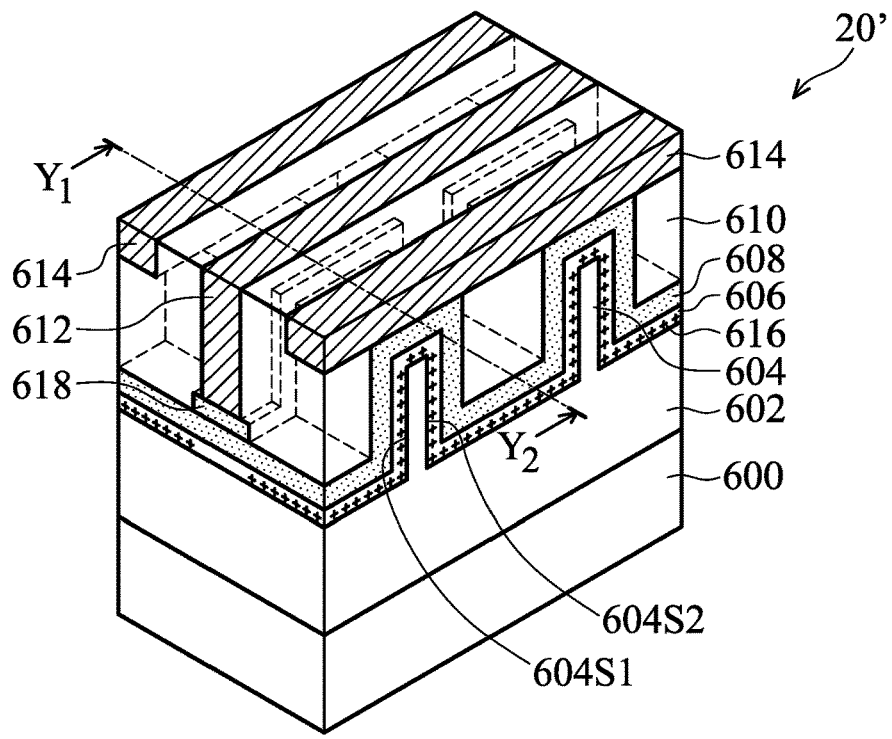
FIG. 6D illustrates a partial perspective view of a high hole mobility transistor 20' according to some embodiments of the present disclosure.
Figure 6E:
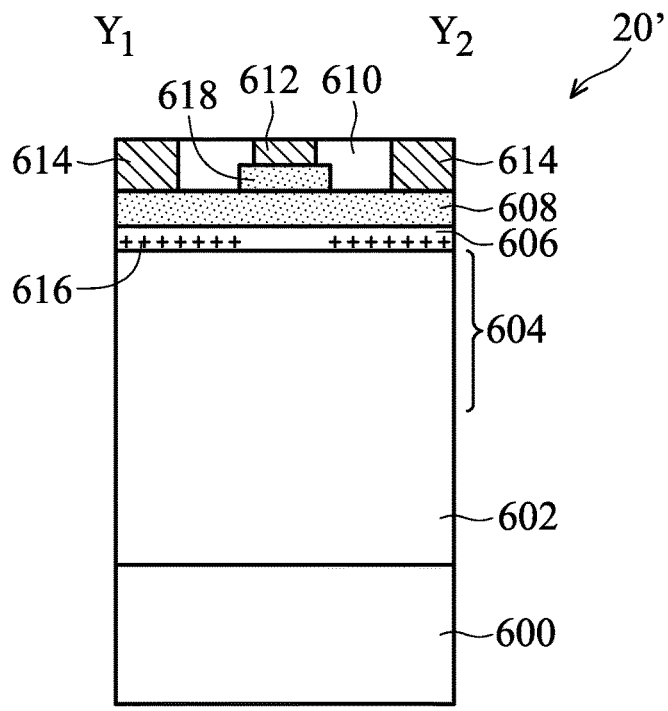
FIG. 6E illustrates a partial cross-sectional view of the high hole mobility transistor 20' of some embodiments of the present disclosure along the cut line $Y_1$-$Y_2$ of FIG. 6D.

Some variations of the present embodiment will be provided below. In some embodiments, as shown in FIGS. 6D and 6E, the high hole mobility transistor 20' further includes a second doped III-V group compound semiconductor layer 618 disposed between the gate electrode 612 and the first doped III-V group compound semiconductor layer 608. Therefore, the high hole mobility transistor 20' is an enhanced mode (i.e., normally-off) semiconductor device.

In some embodiments, the second doped III-V group compound semiconductor layer 618 may include an n-type III-V group compound semiconductor material, and it may include silicon, oxygen, other applicable dopants, or a combination thereof. For example, in the present embodiment, the first III-V group compound semiconductor layer 602 is made of undoped AlGaN, the second III-V group compound semiconductor layer 606 is made of undoped GaN, the first doped III-V group compound semiconductor layer 608 is made of p-type GaN, and the second doped III-V group compound semiconductor layer 618 is made of n-type GaN. However, the present disclosure is not limited thereto. In some other embodiments, the second doped III-V group compound semiconductor layer 608 may also include n-type AlGaN, n-type AlN, n-type GaAs, n-type GaInP, n-type AlGaAs, n-type InP, n-type InAlAs, n-type InGaAs, other applicable III-V group compound semiconductor materials doped with n-type dopants, or a combination thereof.

For example, the dopant concentration in the second doped III-V group compound semiconductor layer 618 may be in a range between $1 \times 10^{15}$ cm$^{-3}$ and $1 \times 10^{20}$ cm$^{-3}$.

In some embodiments, before forming the insulating layer 610, a molecular-beam epitaxy method (MBE), a metalorganic chemical vapor deposition method (MOCVD), a hydride vapor phase epitaxy method (HVPE), other applicable methods, or a combination thereof may be used to form an undoped III-V group compound semiconductor blanket layer on the first doped III-V group compound semiconductor layer 608, and a process such as ion implantation process may be used to dope the dopants into the undoped III-V group compound semiconductor blanket layer to form a doped III-V group compound semiconductor blanket layer. Then, the doped III-V group compound semiconductor blanket layer may be patterned to form the second doped III-V group compound semiconductor layer 618. For example, the patterning process may include a photolithography process, an etching process, other applicable processes, or a combination thereof. In some embodiments, an in-situ doping process may be used to form the second doped III-V group compound semiconductor layer 618.

Since the enhanced mode high hole mobility transistor 20' also includes a III-V group compound semiconductor layer having one or more fin structures, it also has a larger area of the two-dimensional hole gas. Therefore, the device performance may be improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Furthermore, each claim may be an individual embodiment of the present disclosure, and the scope of the present disclosure includes the combinations of every claim and every embodiment of the present disclosure.

What is claimed is:

1. A semiconductor device, comprising:
  a substrate;
  a first III-V group compound semiconductor layer disposed on the substrate, wherein the first III-V group compound semiconductor layer comprises a fin structure comprising a top surface, a first sidewall, and a second sidewall opposite to the first sidewall;
  a second III-V group compound semiconductor layer disposed on the first III-V group compound semiconductor layer, wherein the first III-V group compound semiconductor layer and the second III-V group compound semiconductor layer comprise different materials from each other, and the second III-V group compound semiconductor layer covers the top surface, the first sidewall, and the second sidewall of the fin structure to form a heterojunction along the top surface, the first sidewall, and the second sidewall of the fin structure;
  a gate electrode disposed on the second III-V group compound semiconductor layer; and
  source/drain electrodes disposed on a top surface of the second III-V group compound semiconductor layer.

2. The semiconductor device of claim 1, wherein the second III-V group compound semiconductor layer is conformally disposed on the first III-V group compound semiconductor layer.

3. The semiconductor device of claim 1, further comprising:

a first doped III-V group compound semiconductor layer disposed between the second III-V group compound semiconductor layer and the gate electrode.

4. The semiconductor device of claim 3, wherein the first doped III-V group compound semiconductor layer is conformally disposed on the second III-V group compound semiconductor layer.

5. The semiconductor device of claim 3, wherein the first doped III-V group compound semiconductor layer comprises a p-type III-V group compound semiconductor.

6. The semiconductor device of claim 5, wherein the first III-V group compound semiconductor layer comprises GaN, the second III-V group compound semiconductor layer comprises AlGaN, and the first doped III-V group compound semiconductor layer comprises p-type GaN.

7. The semiconductor device of claim 5, wherein the first III-V group compound semiconductor layer comprises AlGaN, the second III-V group compound semiconductor layer comprises GaN, and the first doped III-V group compound semiconductor layer comprises p-type GaN.

8. The semiconductor device of claim 3, further comprising:
a second doped III-V group compound semiconductor layer disposed between the first doped III-V group compound semiconductor layer and the gate electrode.

9. The semiconductor device of claim 8, wherein the first doped III-V group compound semiconductor layer comprises a p-type III-V group compound semiconductor, and the second doped III-V group compound semiconductor layer comprises an n-type III-V group compound semiconductor.

10. The semiconductor device of claim 9, wherein the first III-V group compound semiconductor layer comprises AlGaN, the second III-V group compound semiconductor layer comprises GaN, the first doped III-V group compound semiconductor layer comprises p-type GaN, and the second doped III-V group compound semiconductor layer comprises n-type GaN.

11. A method of forming a semiconductor device, comprising:
providing a substrate;
forming a first III-V group compound semiconductor layer on the substrate, wherein the first III-V group compound semiconductor layer comprises a fin structure comprising a top surface, a first sidewall, and a second sidewall opposite to the first sidewall;
forming a second III-V group compound semiconductor layer on the first III-V group compound semiconductor layer, wherein the first III-V group compound semiconductor layer and the second III-V group compound semiconductor layer comprise different materials from each other, and the second III-V group compound semiconductor layer covers the top surface, the first sidewall, and the second sidewall of the fin structure to form a heterojunction along the top surface, the first sidewall, and the second sidewall of the fin structure;

forming a gate electrode on the second III-V group compound semiconductor layer and forming source/drain electrodes on a top surface of the second III-V group compound semiconductor layer.

12. The method of forming a semiconductor device of claim 11, wherein the second III-V group compound semiconductor layer is conformally formed on the first III-V group compound semiconductor layer.

13. The method of forming a semiconductor device of claim 11, wherein after forming the second III-V group compound semiconductor layer and before forming the gate electrode, the method further comprises:
forming a first doped III-V group compound semiconductor layer on the second III-V group compound semiconductor layer.

14. The method of forming a semiconductor device of claim 13, wherein the first doped III-V group compound semiconductor layer is conformally formed on the second III-V group compound semiconductor layer.

15. The method of forming a semiconductor device of claim 13, wherein the first doped III-V group compound semiconductor layer comprises a p-type III-V group compound semiconductor.

16. The method of forming a semiconductor device of claim 15, wherein the first III-V group compound semiconductor layer comprises GaN, the second III-V group compound semiconductor layer comprises AlGaN, and the first doped III-V group compound semiconductor layer comprises p-type GaN.

17. The method of forming a semiconductor device of claim 15, wherein the first III-V group compound semiconductor layer comprises AlGaN, the second III-V group compound semiconductor layer comprises GaN, and the first doped III-V group compound semiconductor layer comprises p-type GaN.

18. The method of forming a semiconductor device of claim 13, wherein after forming the first doped III-V group compound semiconductor layer and before forming the gate electrode, the method further comprises:
forming a second doped III-V group compound semiconductor layer on the first doped III-V group compound semiconductor layer.

19. The method of forming a semiconductor device of claim 18, wherein the first doped III-V group compound semiconductor layer comprises a p-type III-V group compound semiconductor, and the second doped III-V group compound semiconductor layer comprises an n-type III-V group compound semiconductor.

20. The semiconductor device of claim 19, wherein the first III-V group compound semiconductor layer comprises AlGaN, the second III-V group compound semiconductor layer comprises GaN, the first doped III-V group compound semiconductor layer comprises p-type GaN, and the second doped III-V group compound semiconductor layer comprises n-type GaN.

* * * * *